United States Patent
Lai et al.

(10) Patent No.: US 12,105,892 B2
(45) Date of Patent: Oct. 1, 2024

(54) ELECTRONIC DEVICE

(71) Applicant: ASUSTeK COMPUTER INC., Taipei (TW)

(72) Inventors: Yi-Lun Lai, Taipei (TW); Cheng-Hui Wu, Taipei (TW); Huan-Hsun Huang, Taipei (TW); Hung-Yi Lin, Taipei (TW); Yi-Ou Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 121 days.

(21) Appl. No.: 17/894,444

(22) Filed: Aug. 24, 2022

(65) Prior Publication Data

US 2023/0098532 A1 Mar. 30, 2023

(30) Foreign Application Priority Data

Sep. 24, 2021 (TW) .................... 110135701

(51) Int. Cl.
*G06F 3/02* (2006.01)
*G06F 3/041* (2006.01)
*G06F 3/14* (2006.01)
*H03K 17/00* (2006.01)

(52) U.S. Cl.
CPC ............ *G06F 3/02* (2013.01); *G06F 3/04166* (2019.05); *H03K 17/002* (2013.01)

(58) Field of Classification Search
CPC ...... G06F 1/3203; G06F 3/1423; G06F 1/266; G06F 9/4418
See application file for complete search history.

(56) References Cited

U.S. PATENT DOCUMENTS

| | | | |
|---|---|---|---|
| 10,338,636 B2 | 7/2019 | Li et al. | |
| 11,039,105 B2 * | 6/2021 | DeCamp, II | G06F 3/1454 |
| 2005/0262367 A1 * | 11/2005 | Shih | G06F 1/325 |
| | | | 713/323 |
| 2010/0271048 A1 * | 10/2010 | Kouno | G06F 3/0445 |
| | | | 324/658 |
| 2013/0132738 A1 * | 5/2013 | Bhogal | G06F 1/266 |
| | | | 713/193 |
| 2020/0379934 A1 * | 12/2020 | Hsieh | G06F 13/387 |

FOREIGN PATENT DOCUMENTS

| | | |
|---|---|---|
| CN | 100336012 C | 9/2007 |
| CN | 101739124 A | 6/2010 |
| CN | 109521836 A | 3/2019 |
| CN | 112866769 A | 5/2021 |
| TW | M572481 U | 1/2019 |
| TW | M617385 U | 9/2021 |

* cited by examiner

*Primary Examiner* — William Boddie
*Assistant Examiner* — Alecia D English
(74) *Attorney, Agent, or Firm* — McClure, Qualey & Rodack, LLP

(57) ABSTRACT

An electronic device includes: at least one connection interface, to receive an external signal. A first signal switching multiplexer is connected to the connection interface. A laptop system is connected to the first signal switching multiplexer, to operate in a laptop mode. A drawing board system is connected to the first signal switching multiplexer, to operate in a drawing board mode and an independent screen mode. A switching switch generates a switching signal and transmits it to the first signal switching multiplexer, the laptop system, and the drawing board system, to select the laptop mode, the drawing board mode, or the independent screen mode.

16 Claims, 12 Drawing Sheets

ELECTRONIC DEVICE

CROSS-REFERENCE TO RELATED APPLICATION

This application claims the priority benefit of Taiwan application serial No. 110135701, filed on Sep. 24, 2021. The entirety of the above-mentioned patent application is hereby incorporated by reference herein and made a part of the specification.

BACKGROUND OF THE INVENTION

Field of the Invention

The disclosure relates to an electronic device integrating functions of a drawing board and an independent screen.

Description of the Related Art

With the improvement and popularization of laptop functions, more and more users purchase new laptops to meet different requirements. An existing laptop is connected to an external screen through a connection interface, such as a universal serial bus (USB) or a high definition multimedia interface (HDMI). For a foldable laptop on the market, when the laptop is folded back, the keyboard and the touchpad are disabled, so that the user uses the laptop as a drawing board.

However, existing laptops still do not meet the diversified requirement. For a user who owns a laptop not having a drawing board function, when the user needs a drawing board, the user has to additionally purchase a drawing board and connect the drawing board to the laptop. Even if the laptop includes a touchscreen used as a drawing board, the laptop and the operating system (OS) are still in a power-on state at this time, which does not meet the power-saving requirement. In addition, if the user needs to connect the laptop to an external screen to work in a multi-screen mode, the external screen needs to be connected through the laptop. That is because the laptop itself is not used as an independent external screen, and has limited applications.

BRIEF SUMMARY OF THE INVENTION

The disclosure provides an electronic device, and the electronic device includes at least one connection interface, a first signal switching multiplexer, a laptop system, a drawing board system, a switching switch, a second signal switching multiplexer, a touchscreen, and a touch controller. The connection interface is configured to receive an external signal. The first signal switching multiplexer is electrically connected to the connection interface, to receive the external signal. The laptop system is electrically connected to the first signal switching multiplexer, and is configured to operate in a laptop mode. The drawing board system is electrically connected to the first signal switching multiplexer, and is configured to operate in a drawing board mode and an independent screen mode. The switching switch is electrically connected to the first signal switching multiplexer, the laptop system, and the drawing board system. The switching switch generates a switching signal and transmits the switching signal to the first signal switching multiplexer, the laptop system, and the drawing board system, to select the laptop mode in the laptop system, or the drawing board mode or the independent screen mode in the drawing board system according to the switching signal, so that the first signal switching multiplexer transmits the external signal to the laptop system or the drawing board system according to the switching signal, and the laptop system or the drawing board system performs corresponding processing according to a type of the external signal, to output an electronic signal. The second signal switching multiplexer is electrically connected to the laptop system, the drawing board system, and the switching switch, to transmit the electronic signal to the corresponding touchscreen or touch controller according to the switching signal. The touchscreen is electrically connected to the second signal switching multiplexer, to display the received electronic signal on the touchscreen. The touch controller is electrically connected to the second signal switching multiplexer and the touchscreen, to control the touchscreen according to the received electronic signal.

In conclusion, the disclosure provides an electronic device with various operating modes, and the electronic device provides a laptop mode, a drawing board mode, and an independent screen mode, to meet the diversified requirement of the user. In addition, in the disclosure, when the operating mode of the drawing board mode or the independent screen mode is selected, an original internal main system (a laptop system) of the electronic device is maintained in a sleep mode or a power-off mode, to save unnecessary power consumption and meet the power-saving requirement.

DETAILED DESCRIPTION OF THE EMBODIMENTS

Figure 1:
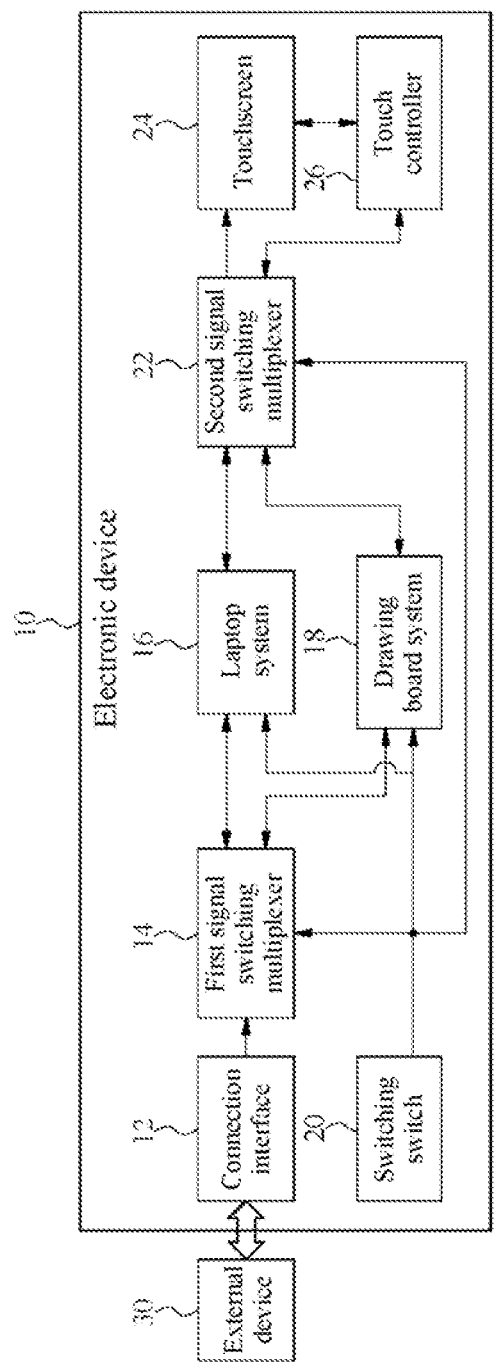
FIG. 1 is a schematic block diagram of an electronic device according to an embodiment of the disclosure.

Referring to FIG. 1, an electronic device 10 includes at least one connection interface 12, a first signal switching multiplexer 14, a laptop system 16, a drawing board system 18, a switching switch 20, a second signal switching multiplexer 22, a touchscreen 24 (including a display function and a touch function), and a touch controller 26. In this embodiment, the electronic device 10 is a laptop.

As shown in FIG. 1, the connection interface 12 is configured to be connected to an external device 30, so that the electronic device 10 is electrically connected to the external device 30 through the connection interface 12, to receive an external signal. The first signal switching multiplexer 14 is electrically connected to the connection interface 12, to receive the external signal. The laptop system 16 is electrically connected to the first signal switching multiplexer 14, and is configured to operate in a laptop mode. The laptop system 16 receives the external signal through the first signal switching multiplexer 14. The drawing board system 18 is also electrically connected to the first signal switching multiplexer 14, and is configured to operate in a drawing board mode and an independent screen mode. The drawing board system 18 receives the external signal through the first signal switching multiplexer 14, and the laptop system 16 and the drawing board system 18 are each independent operating system. The switching switch 20 is electrically connected to the first signal switching multiplexer 14, the laptop system 16, and the drawing board system 18. The switching switch 20 correspondingly generates a switching signal according to a selection of a user, and transmits the switching signal to the first signal switching multiplexer 14, the laptop system 16, and the drawing board system 18, to select the laptop mode in the laptop system 16, or the drawing board mode or the independent screen mode in the drawing board system 18 according to the switching signal, so that the first signal switching multiplexer 14 transmits the external signal to the selected laptop system 16 or drawing board system 18 according to the switching signal, and the laptop system 16 or the drawing board system 18 performs corresponding processing according to a type of the external signal, to output an electronic signal. The second signal switching multiplexer 22 is electrically connected to the laptop system 16, the drawing board system 18, and the switching switch 20. The second signal switching multiplexer 22 transmits the electronic signal to the corresponding touchscreen 24 or touch controller 26 according to the switching signal. The touchscreen 24 is electrically connected to the second signal switching multiplexer 22. When the second signal switching multiplexer 22 transmits the electronic signal to the touchscreen 24 according to the switching signal, the touchscreen 24 displays the received electronic signal on the touchscreen 24. The touch controller 26 is electrically connected to the second signal switching multiplexer 22 and the touchscreen 24. When the second signal switching multiplexer 22 transmits the electronic signal to the touch controller 26 according to the switching signal, the touch controller 26 correspondingly controls the touchscreen 24 according to the received electronic signal.

Figure 2A:
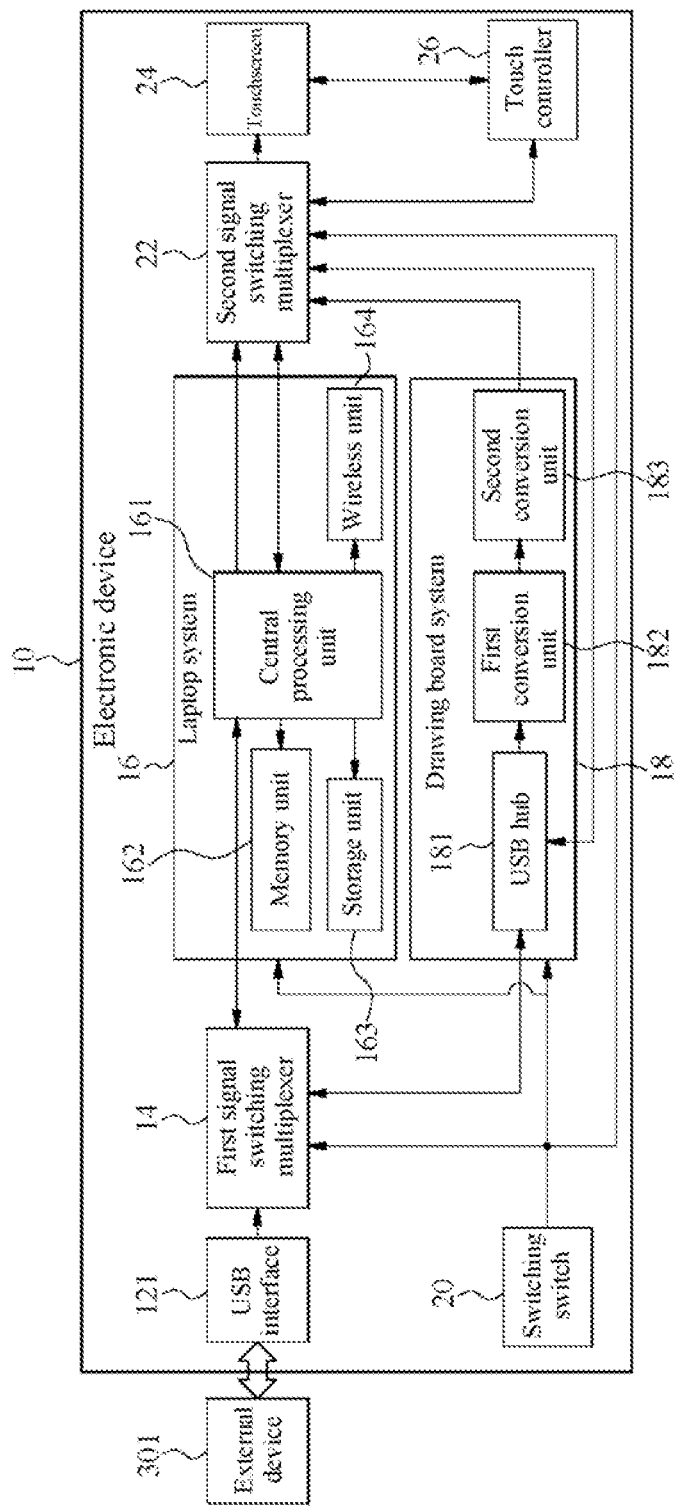
FIG. 2A is a schematic block diagram of an electronic device according to another embodiment of the disclosure.

In an embodiment, referring to FIG. 1 and FIG. 2A together, in the electronic device 10, when the connection interface 12 uses a universal serial bus (USB) interface 121 (referred to as a USB interface 121 below), the external signal is a USB signal. The USB interface 121 herein is a USB Type-C interface, and has a power transmission function, a data transmission function, and an image transmission function, to be connect to an external device 301 through the USB interface 121. As shown in FIG. 1 and FIG. 2A, the laptop system 16 is a basic system originally built in a general laptop, and includes a central processing unit (CPU) 161, a memory unit 162, a storage unit 163, and a wireless unit 164. The CPU 161 is electrically connected to the first signal switching multiplexer 14, the second signal switching multiplexer 22, the memory unit 162, the storage unit 163, and the wireless unit 164, and the laptop system 16 is configured to execute the laptop mode. The drawing board system 18 includes a USB hub 181, a first conversion unit 182, and a second conversion unit 183. The drawing board system 18 is configured to execute the drawing board mode and the independent screen mode. The USB hub 181 is electrically connected to the first signal switching multiplexer 14 and the second signal switching multiplexer 22, to receive the external signal. When the external signal is the USB signal, the USB hub 181 uses a touch related data signal in the external signal as an electronic signal and directly transmits the electronic signal to the touch controller 26 through the second signal switching multiplexer 22. The USB hub 181 also transmits an image signal in the external signal to the first conversion unit 182. The first conversion unit 182 is electrically connected to the USB hub 181, to receive the external signal and convert the image signal in the external signal from the USB signal into a low-voltage differential signal (LVDS). The second conversion unit 183 is electrically connected to the first conversion unit 182 and the second signal switching multiplexer 22, to convert the LVDS into a display port (DP) signal. The second conversion unit 183 uses the DP signal as an electronic signal, transmits the electronic signal to the touchscreen 24 through the second signal switching multiplexer 22, and displays the electronic signal on the touchscreen 24.

Figure 2B:
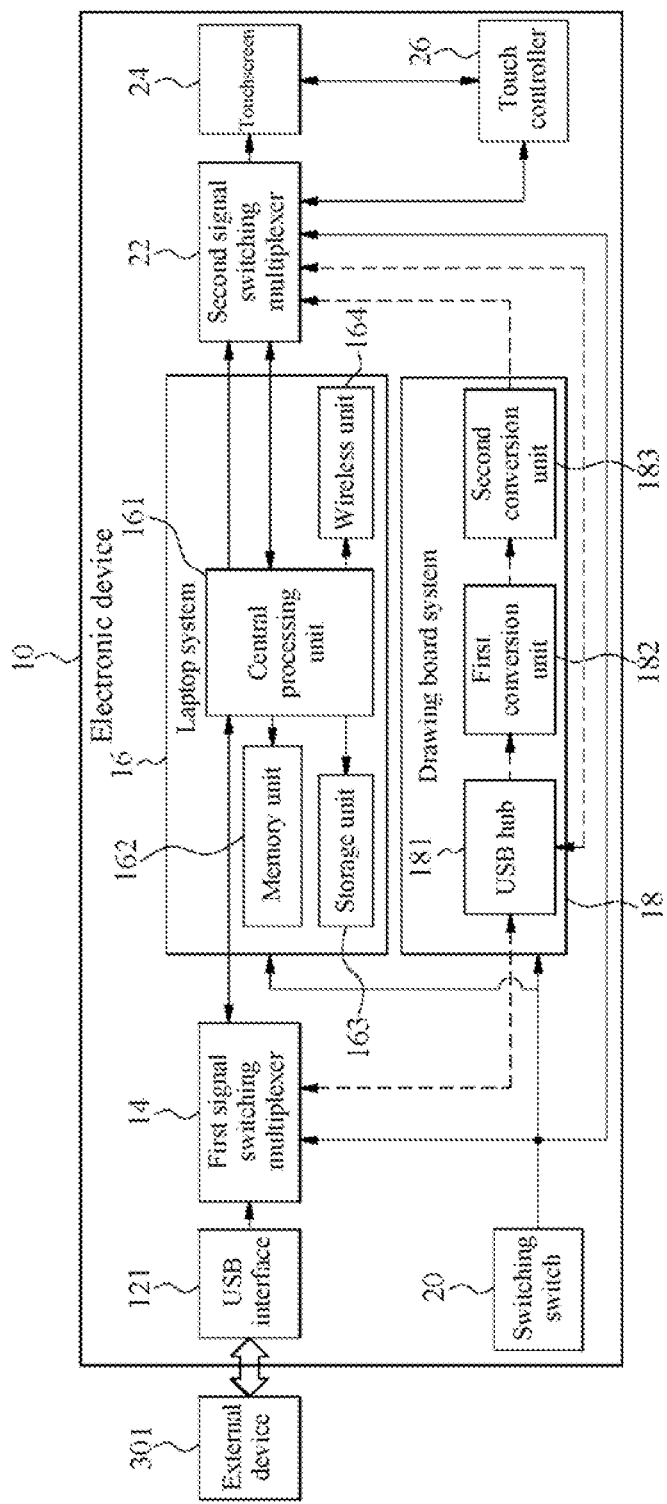
FIG. 2B is a schematic block diagram of an electronic device executing a laptop mode according to an embodiment of the disclosure.

As shown in FIG. 1 and FIG. 2B, when the user selects the laptop mode through the switching switch 20, the switching switch 20 is set in the laptop mode and correspondingly generates a switching signal, and respectively transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the laptop mode is selected as the current operating mode. The laptop mode is executed by the laptop system 16. In this case, the drawing board system 18 performs no action, and the USB interface 121 (or the connection interface 12) is only used as a simple input/output interface.

Figure 2C:
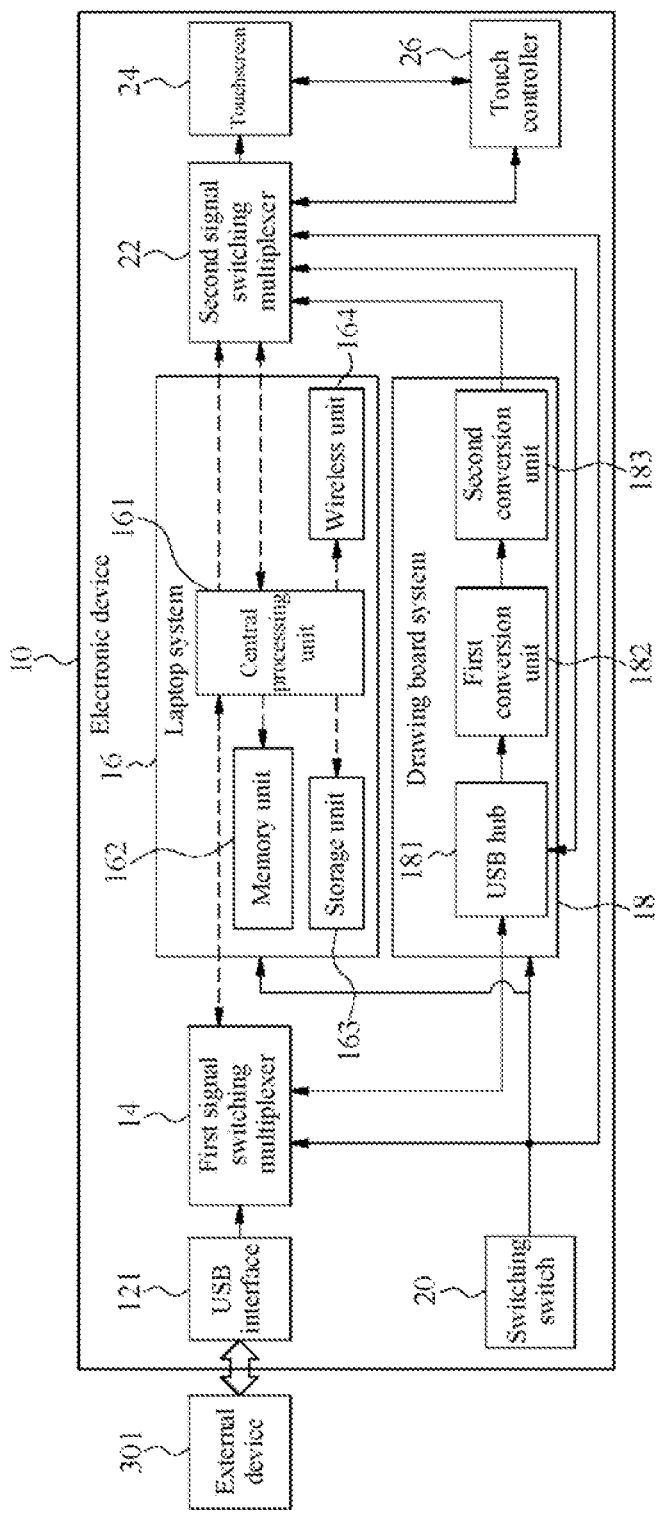
FIG. 2C is a schematic block diagram of an electronic device executing a drawing board mode according to an embodiment of the disclosure.

As shown in FIG. 2C, when the user selects the drawing board mode in the drawing board system 18 through the switching switch 20, the switching switch 20 is set in the drawing board mode and correspondingly generates a switching signal, and respectively transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the drawing board mode is selected as the current operating mode. The drawing board mode is executed by the drawing board system 18. In this case, the laptop system 16 performs no action, and the laptop system 16 is in a sleep state or a power-off state. In an embodiment, if the laptop system 16 is in an S4 sleep state of a Windows system, although the OS is shut down, user data is stored; or if the laptop system 16 is originally in an S5 power-off state, the OS directly enters the drawing board mode.

As shown in FIG. 2C, in the drawing board mode, the USB interface 121 is connected to the external device 301, to receive the USB signal used as the external signal. The USB signal is transmitted to the USB hub 181 through the first signal switching multiplexer 14. The USB hub 181 divides the USB signal into two parts for transmission. One part is a data signal in the USB signal, and the data signal is directly transmitted to the touch controller 26 through the second signal switching multiplexer 22, to control the touchscreen 24. The other part is an image signal in the USB signal, and after the image signal is converted into an LVDS through the first conversion unit 182 and the LVDS is converted into a DP signal through the second conversion unit 183, the DP signal is transmitted to the touchscreen 24 through the second signal switching multiplexer 22 and is displayed on the touchscreen 24.

Figure 2D:
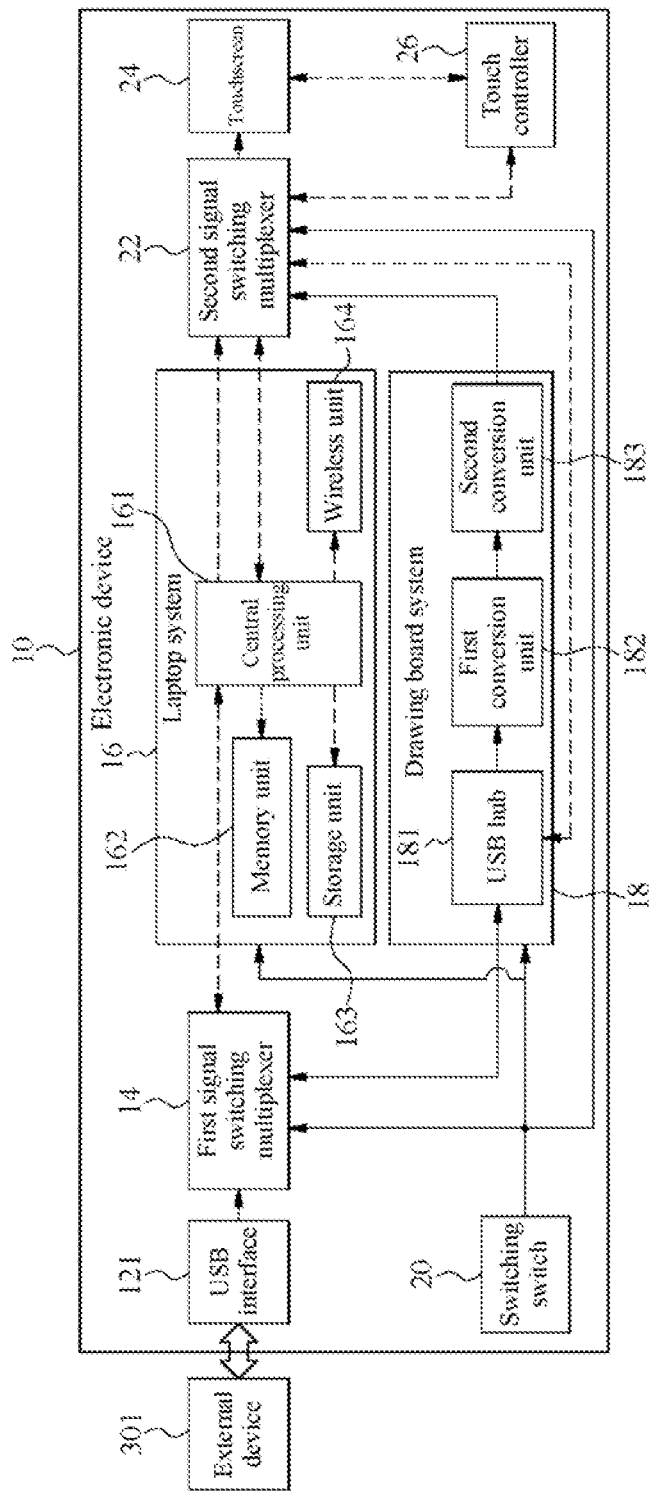
FIG. 2D is a schematic block diagram of an electronic device executing an independent screen mode according to an embodiment of the disclosure.

As shown in FIG. 2D, when the user selects the independent screen mode in the drawing board system 18 through the switching switch 20, the switching switch 20 is set in the independent screen mode and correspondingly generates a switching signal, and transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the independent screen mode is selected as the current operating mode. The independent screen mode is executed by the drawing board system 18. In this case, the laptop system 16 performs no action, and the laptop system 16 is in a sleep state or a power-off state.

As shown in FIG. 2D, in the independent screen mode, the USB interface 121 is connected to the external device 301, to receive the USB signal used as the external signal. In this case, the USB signal is an image signal, and the USB signal is transmitted to the USB hub 181 through the first signal switching multiplexer 14. The USB hub 181 transmits the USB signal to the first conversion unit 182, and after the USB signal is converted into an LVDS through the first conversion unit 182 and the LVDS is converted into a DP signal through the second conversion unit 183, the DP signal is transmitted to the touchscreen 24 through the second signal switching multiplexer 22 and is displayed on the touchscreen 24. In this embodiment, because the external signal is from the USB interface 121, and the USB interface 121 provides both an image signal and a power signal to the drawing board system 18, the touchscreen 24 has the touch function.

Figure 3A:
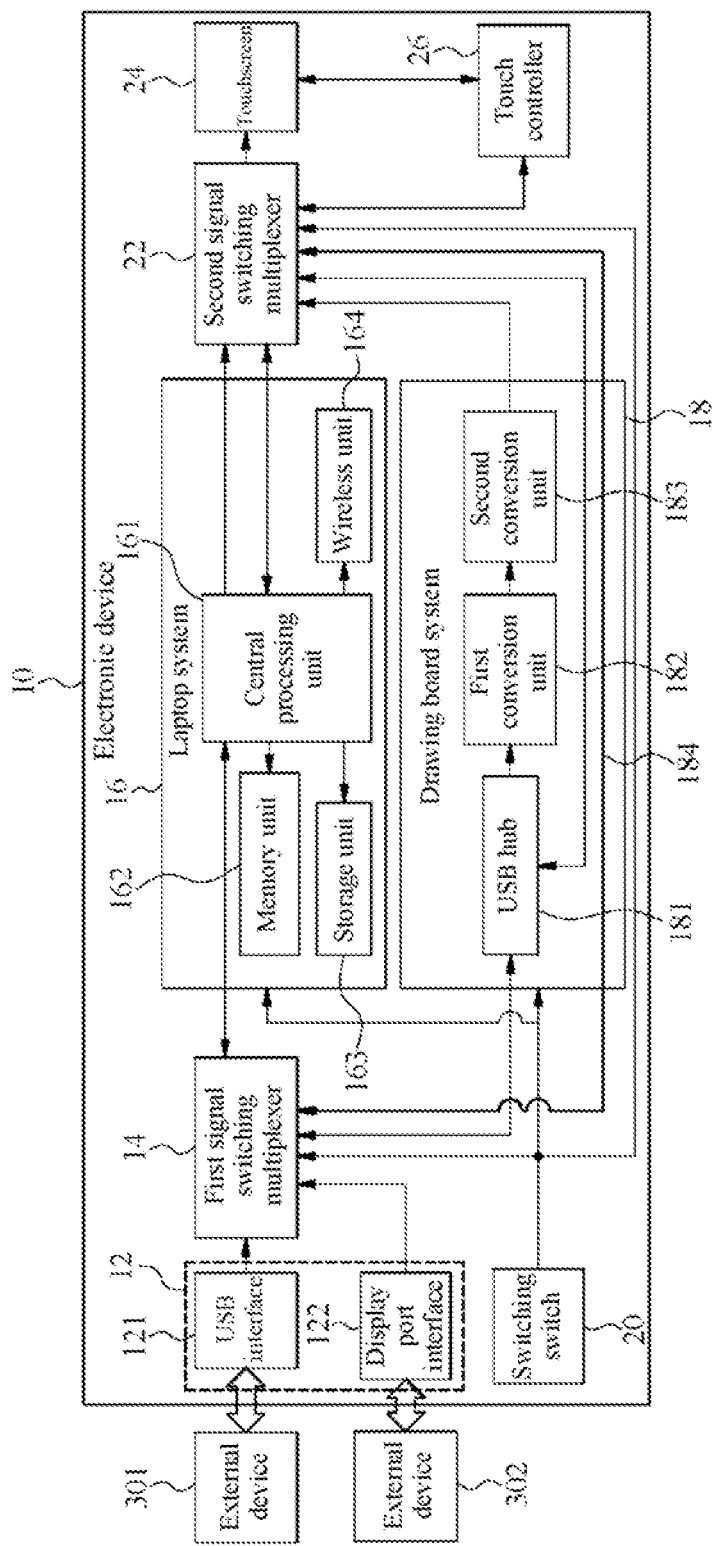
FIG. 3A is a schematic block diagram of an electronic device according to still another embodiment of the disclosure.

In an embodiment, referring to FIG. 1 and FIG. 3A together, the connection interface 12 further includes a USB interface 121 and a DP interface 122 used as an image connection interface, and is connected to an external device 301 through the USB interface 121 and connected to an external device 302 through the DP interface 122. The external signal is a USB signal from the USB interface 121 or an image signal from the DP interface 122. In the electronic device 10, the USB interface 121 and the DP interface 122 are both electrically connected to the first signal switching multiplexer 14. The structure of the laptop system 16 is the same as that in the foregoing embodiment. Therefore, details are not described herein again. The drawing board system 18 includes a USB hub 181, a first conversion unit 182, and a second conversion unit 183. The USB hub 181 is electrically connected to the first signal switching multiplexer 14 and the second signal switching multiplexer 22, to receive the USB signal from the USB interface 121. The USB hub 181 uses a touch-related data signal in the external signal as an electronic signal and directly transmits the electronic signal to the touch controller 26 through the second signal switching multiplexer 22. The USB hub 181 also transmits an image signal in the external signal to the first conversion unit 182. The first conversion unit 182 is electrically connected to the USB hub 181, to receive the USB signal and convert an image signal in the USB signal from the USB signal into an LVDS. The second conversion unit 183 is electrically connected to the first conversion unit 182 and the second signal switching multiplexer 22, to convert the LVDS into a first DP signal. The second conversion unit 183 uses the first DP signal as an electronic signal, transmits the electronic signal to the touchscreen 24 through the second signal switching multiplexer 22, and displays the electronic signal on the touchscreen 24. The electronic device 10 further includes a transmission channel 184, and the transmission channel 184 is electrically connected to the first signal switching multiplexer 14 and the second signal switching multiplexer 22. After sequentially passing through the first signal switching multiplexer 14 and the transmission channel 184, the image signal from the DP interface 122 is directly transmitted to the touchscreen 24 through the second signal switching multiplexer 22 and is displayed on the touchscreen 24.

Figure 3B:
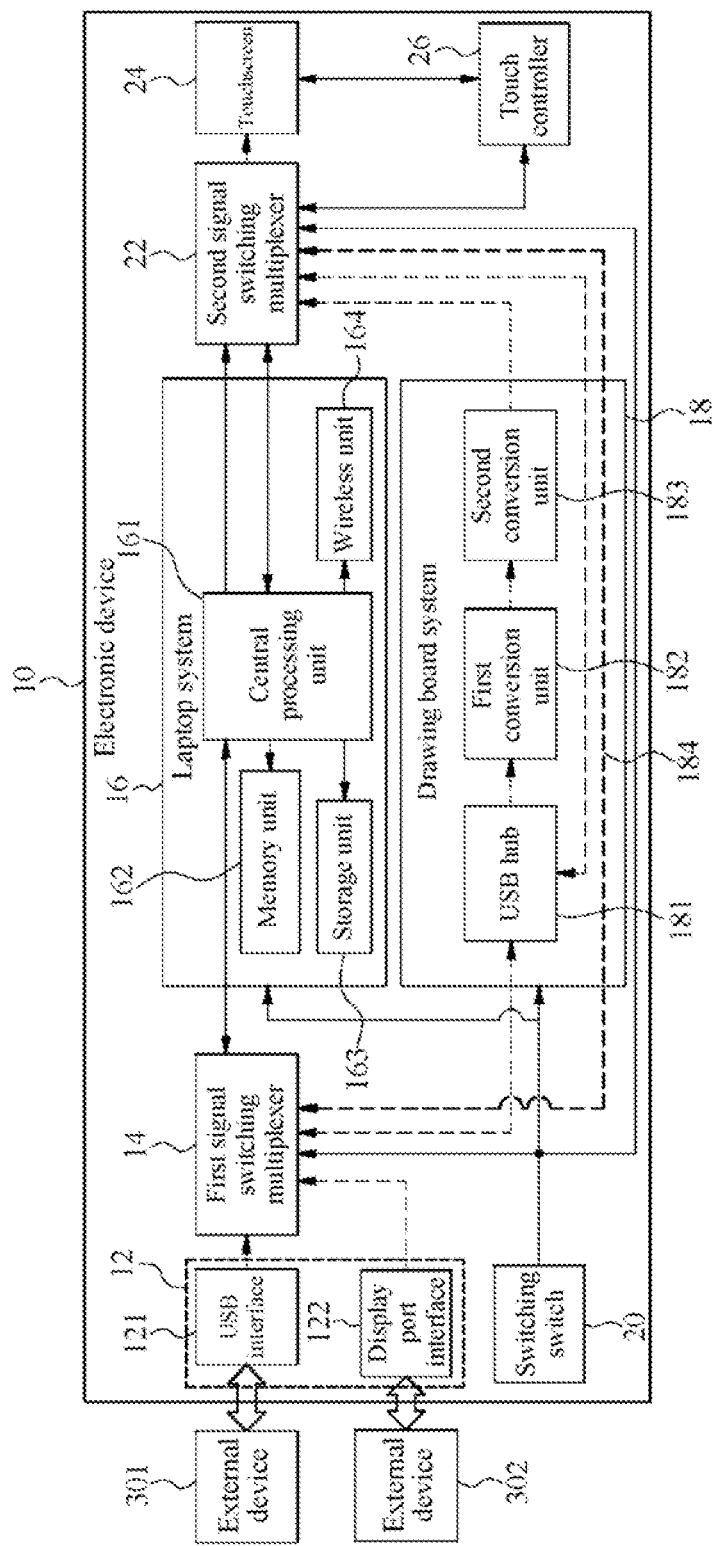
FIG. 3B is a schematic block diagram of an electronic device executing a laptop mode according to an embodiment of the disclosure.

As shown in FIG. 3B, when the user selects the laptop mode in the laptop system 16 through the switching switch 20, the switching switch 20 is set in the laptop mode and correspondingly generates a switching signal, and transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the laptop mode is selected as the current operating mode. The laptop mode is executed by the laptop system 16. In this case, the drawing board system 18 performs no action, and the USB interface 121 is only used as a simple input/output interface.

Figure 3C:
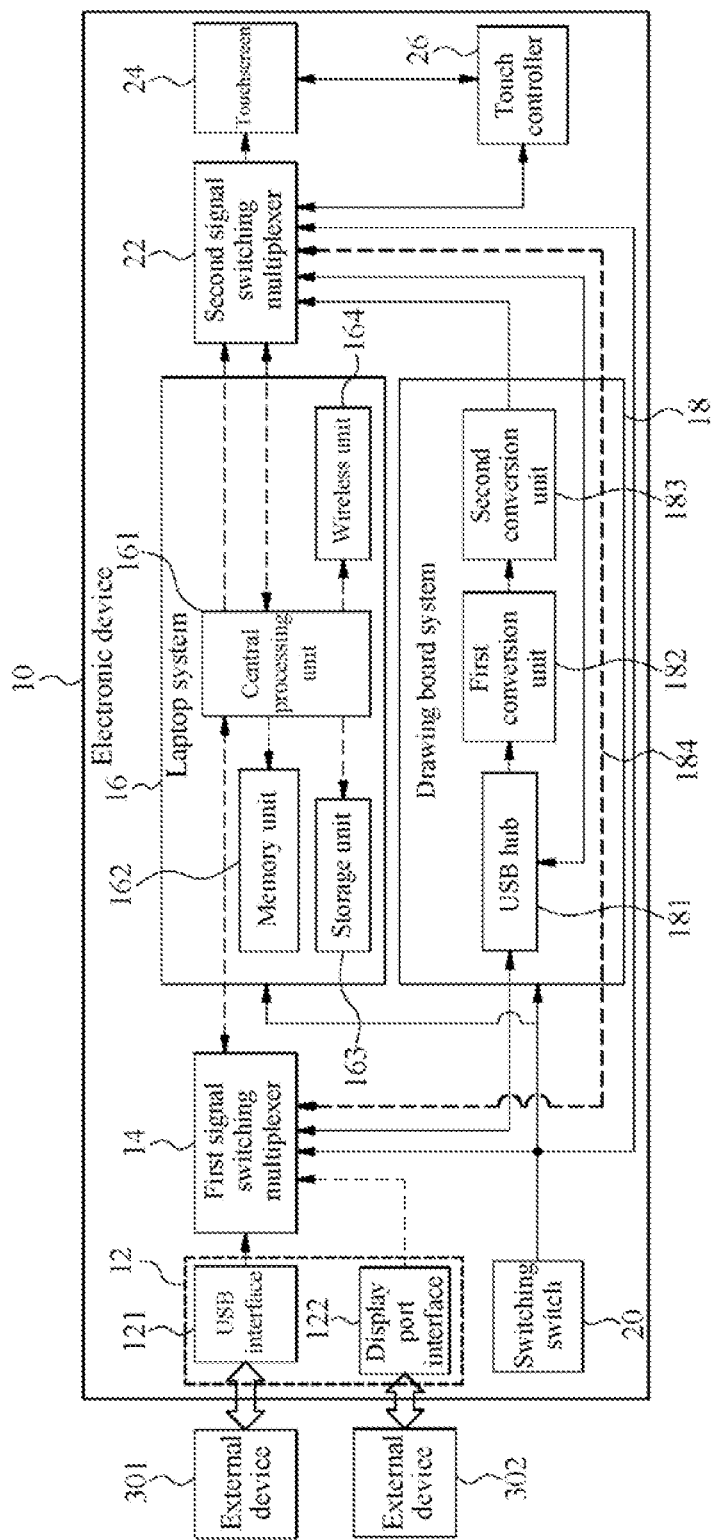
FIG. 3C is a schematic block diagram of an electronic device executing a drawing board mode according to an embodiment of the disclosure.
Figure 3D:
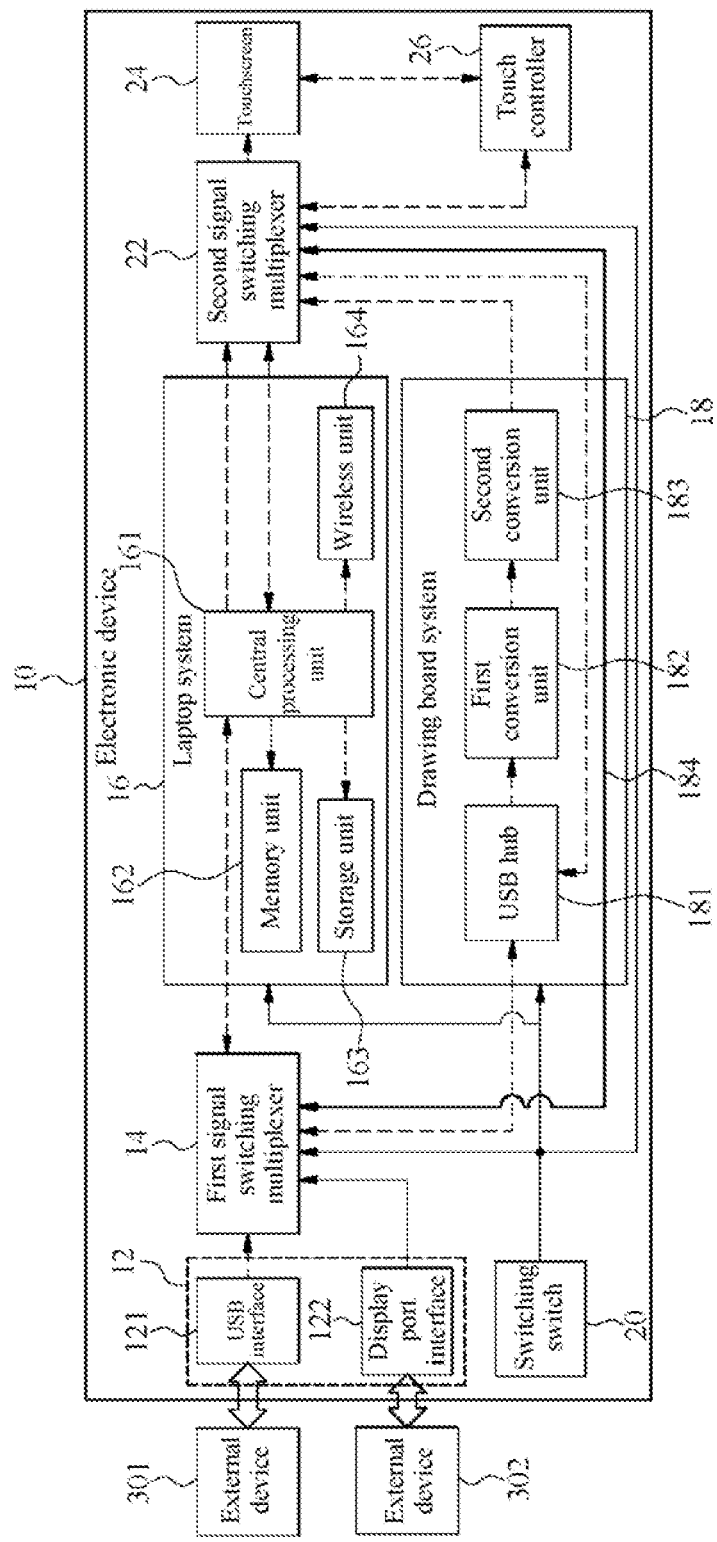
FIG. 3D is a schematic block diagram of an electronic device executing an independent screen mode according to an embodiment of the disclosure.

As shown in FIG. 3C and FIG. 3D, when the user selects the drawing board mode or the independent screen mode in the drawing board system 18 through the switching switch 20, the switching switch 20 is set in the drawing board mode or the independent screen mode and correspondingly generates a switching signal, and transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the drawing board mode or the independent screen mode is selected as the current operating mode. The drawing board mode or the independent screen mode is executed by the drawing board system 18. In this case, the laptop system 16 performs no action, and the laptop system 16 is in a sleep state or a power-off state.

As shown in FIG. 3C, in the drawing board mode, the USB interface 121 is connected to the external device 301, to receive the USB signal used as the external signal. The USB signal is transmitted to the USB hub 181 through the first signal switching multiplexer 14. The USB hub 181 divides the USB signal into two parts for transmission. One part is a data signal in the USB signal, and the data signal is directly transmitted to the touch controller 26 through the second signal switching multiplexer 22, to control the touchscreen 24. The other part is an image signal in the USB signal, and after the image signal is converted into an LVDS through the first conversion unit 182 and the LVDS is converted into a first DP signal through the second conversion unit 183, the first DP signal is transmitted to the touchscreen 24 through the second signal switching multiplexer 22 and is displayed on the touchscreen 24.

As shown in FIG. 3D, in the independent screen mode, the DP interface 122 is connected to the external device 302, to receive the image signal used as the external signal. In this case, the image signal is a second DP signal, and the second DP signal is transmitted to the transmission channel 184 through the first signal switching multiplexer 14. The transmission channel 184 transmits the second DP signal to the touchscreen 24 through the second signal switching multiplexer 22 and displays the second DP signal on the touchscreen 24. In this embodiment, because the external signal is from the DP interface 122, no additional image signal conversion component is required, and the second DP signal is directly transmitted to the touchscreen 24 through the first signal switching multiplexer 14, the transmission channel 184, and the second signal switching multiplexer 22. However, because the drawing board system 18 provides no touch signal, the touchscreen 24 only provides the display function, and does not have the touch function.

In another embodiment, as shown in FIG. 3A, in the independent screen mode, in addition to receiving the external signal (the image signal) through the DP interface 122, the electronic device 10 of the disclosure selectively receives the external signal through the USB interface 121, which depends on the user requirements. If the USB interface 121 is selected to transmit the external signal, the action thereof is the same as that in the embodiment of FIG. 2A. Therefore, details are not described herein again.

Figure 4A:
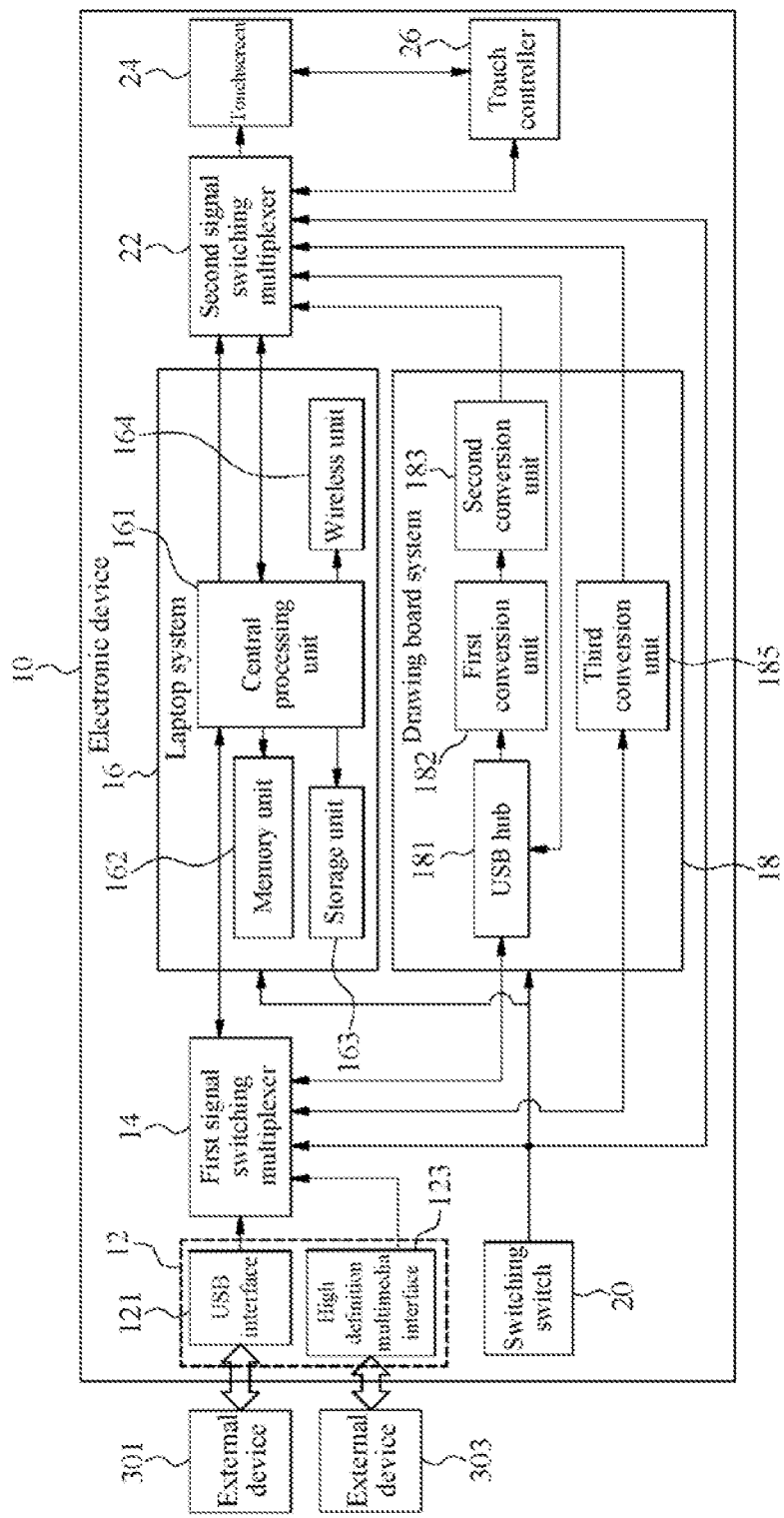
FIG. 4A is a schematic block diagram of an electronic device according to yet another embodiment of the disclosure.

In an embodiment, referring to FIG. 1 and FIG. 4A together, the connection interface 12 further includes a USB interface 121 and a high definition multimedia interface (HDMI) 123 used as an image connection interface, and is connected to an external device 301 through the USB interface 121 and connected to an external device 303 through the HDMI. The external signal is a USB signal from the USB interface 121 or an HDMI signal from the HDMI 123. In the electronic device 10, both the USB interface 121 and the HDMI 123 are electrically connected to the first signal switching multiplexer 14, so that the first signal switching multiplexer 14 receives the USB signal or the HDMI signal. The structure of the laptop system 16 is the same as that in the foregoing embodiment. Therefore, details are not described herein again. The drawing board system 18 includes a USB hub 181, a first conversion unit 182, a second conversion unit 183, and a third conversion unit 185. The USB hub 181 is electrically connected to the first signal switching multiplexer 14 and the second signal switching multiplexer 22, to receive the USB signal. The USB hub 181 uses a touch-related data signal in the USB signal as an electronic signal and directly transmits the electronic signal to the touch controller 26 through the second signal switching multiplexer 22. The USB hub 181 also transmits an image signal in the USB signal to the first conversion unit 182. The first conversion unit 182 is electrically connected to the USB hub 181, to receive the USB signal and convert the image signal in the USB signal from the USB signal into an LVDS. The second conversion unit 183 is electrically connected to the first conversion unit 182 and the second signal switching multiplexer 22, to convert the LVDS into a first DP signal. The second conversion unit 183 uses the first DP signal as an electronic signal, transmits the electronic signal to the touchscreen 24 through the second signal switching multiplexer 22, and displays the electronic signal on the touchscreen 24. The third conversion unit 185 is electrically connected to the first signal switching multiplexer 14 and the second signal switching multiplexer 22.

After the HDMI signal from the HDMI 123 is transmitted to the first signal switching multiplexer 14, the HDMI signal is transmitted to the corresponding third conversion unit 185 through the first signal switching multiplexer 14. The HDMI signal is converted into a second DP signal through the third conversion unit 185, and the second DP signal is transmitted to the touchscreen 24 through the second signal switching multiplexer 22 and is displayed on the touchscreen 24.

As shown in FIG. 4A, when the user selects the laptop mode in the laptop system 16 through the switching switch 20, the switching switch 20 is set in the laptop mode and correspondingly generates a switching signal, and transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the laptop mode is selected as the current operating mode. The laptop mode is executed by the laptop system 16. In this case, the drawing board system 18 performs no action.

When the user selects the drawing board mode or the independent screen mode in the drawing board system 18 through the switching switch 20, the switching switch 20 is set in the drawing board mode or the independent screen mode and correspondingly generates a switching signal, and transmits the switching signal to the first signal switching multiplexer 14, the laptop system 16, the drawing board system 18, and the second signal switching multiplexer 22, to notify the first signal switching multiplexer 14, the laptop system 16, the drawing board system 18, and the second signal switching multiplexer 22 that the drawing board mode or the independent screen mode is selected as the current operating mode. The drawing board mode or the independent screen mode is executed by the drawing board system 18. In this case, the laptop system 16 performs no action, and the laptop system 16 is in a sleep state or a power-off state.

Figure 4B:
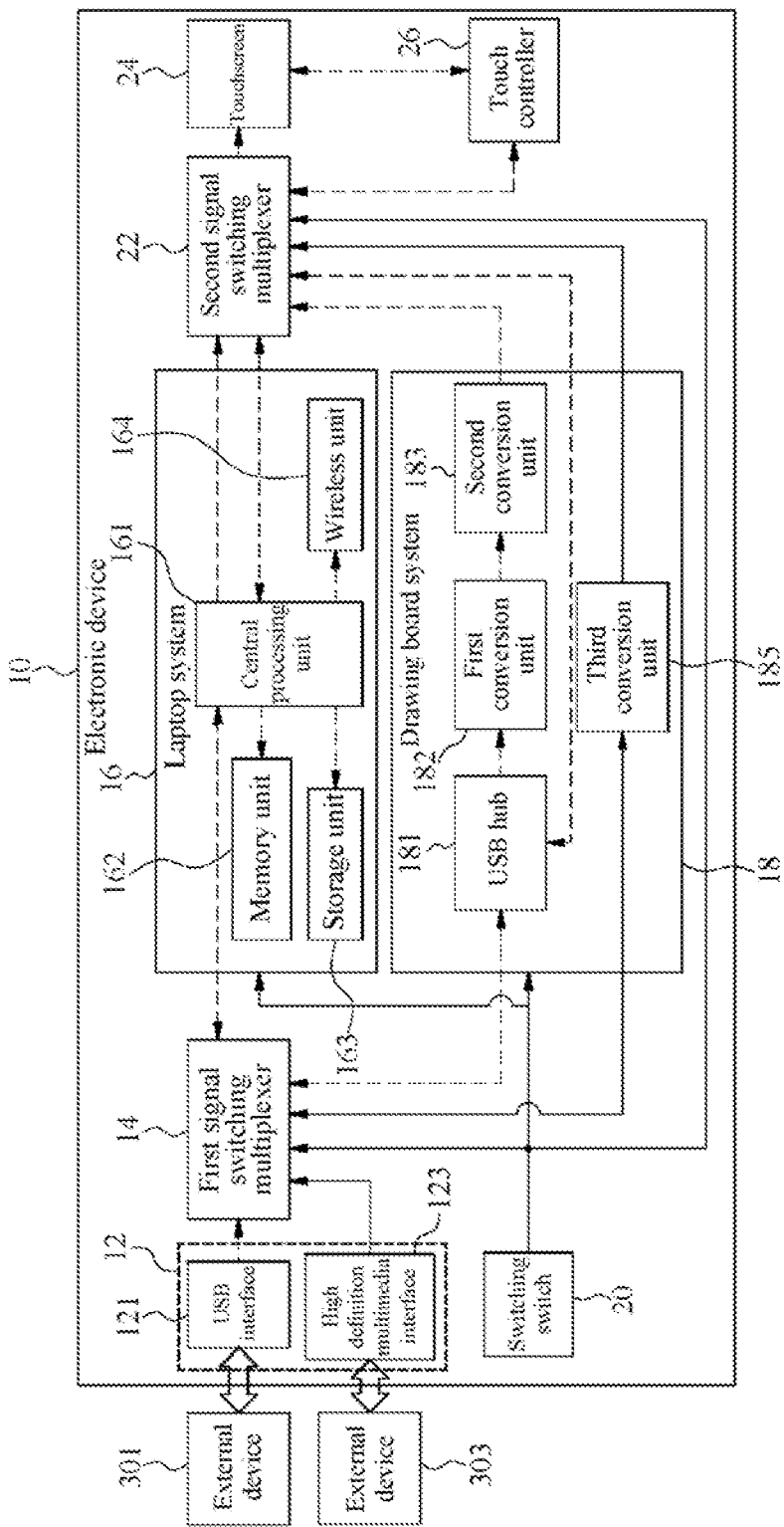
FIG. 4B is a schematic block diagram of an electronic device executing an independent screen mode according to an embodiment of the disclosure.

As shown in FIG. 4A, in the laptop mode or the drawing board mode, detailed actions of the laptop system 16 and the drawing board system 18 are the same as the actions in the laptop mode and the drawing board mode in FIG. 3B and FIG. 3C. Therefore, refer to the foregoing description, and details are not described herein again. As shown in FIG. 4B, in the independent screen mode of the drawing board system 18, the HDMI 123 is connected to the external device 303, to receive the image signal used as the external signal. In this case, the image signal is an HDMI signal, and the HDMI signal is transmitted to the third conversion unit 185 in the transmission channel 184 through the HDMI 123 and the first signal switching multiplexer 14. The third conversion unit 185 converts the HDMI signal into a second DP signal, and the second DP signal is transmitted to the touchscreen 24 through the second signal switching multiplexer 22 and is displayed on the touchscreen 24. In this embodiment, the external signal is from the HDMI 123. However, because the drawing board system 18 provides no touch signal, the touchscreen 24 only provides the display function, and does not have the touch function.

In another embodiment, as shown in FIG. 4A, in the independent screen mode, in addition to receiving the external signal through the HDMI 123, the electronic device 10 of the disclosure selectively receives the external signal through the USB interface 121, which depends on the user requirements. If the USB interface 121 is selected to transmit the external signal (the image signal), the action thereof is the same as that in the embodiment of FIG. 2A. Therefore, details are not described herein again.

In an embodiment, the DP signal is a DP signal of each version, or a derivative embedded DP (eDP) signal.

Figure 5:
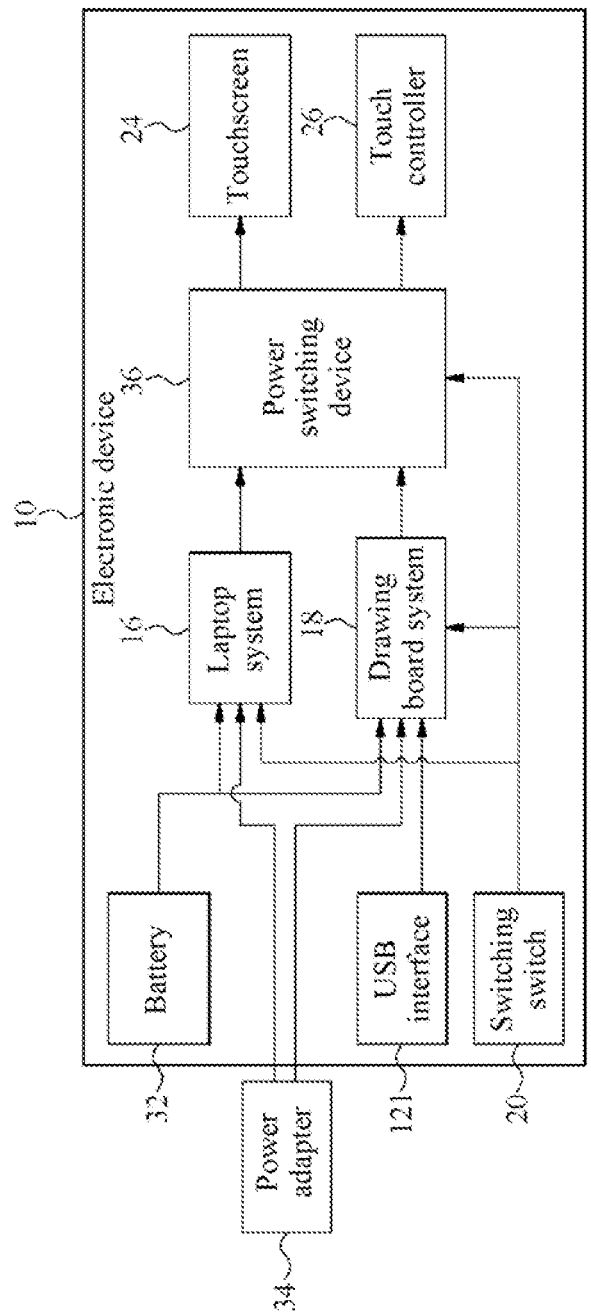
FIG. 5 is a schematic block diagram of an electronic device with power supply according to an embodiment of the disclosure.

The electronic device 10 of the disclosure further includes a power supply structure. Referring to FIG. 5, the power structure is applicable to the electronic device 10 in the foregoing embodiments. As shown in FIG. 5, the electronic device 10 further includes a battery 32 and a power switching device 36, and the electronic device 10 further matches with a power adapter 34. The battery 32 is electrically connected to the laptop system 16 and the drawing board system 18, the power adapter 34 is electrically connected to the laptop system 16 and the drawing board system 18, to selectively provide power to the entire electronic device 10 including the laptop system 16 and the drawing board system 18 through the internal battery 32 and the external power adapter 34. The power switching device 36 is electrically connected to the laptop system 16, the drawing board system 18, the switching switch 20, the touchscreen 24, and the touch controller 26. The power switching device 36 provides power from the laptop system 16 or the drawing board system 18 to the touchscreen 24 or both the touchscreen 24 and the touch controller 26 according to a switching signal, to provide power required by the touchscreen 24 and the touch controller 26 in different operating modes. When the electronic device 10 operates in the laptop mode, the laptop system 16 manages the power; and when the electronic device 10 operates in the drawing board mode or the independent screen mode, the drawing board system 18 manages the power. In addition, during use, the USB interface 121 further provides power required by the laptop system 16 and the drawing board system 18, and the USB interface 121 is a USB Type-A interface or a USB Type-C interface of version 3.0. When the electronic device 10 switches to the drawing board mode or the independent screen mode, the electronic device 10 switches to that the drawing board system 18 manages the power, the laptop system 16 enters a sleep state or a power-off state, and the USB interface 121 provides power to the drawing board system 18. When the electronic device 10 switches to the drawing board mode or the independent screen mode, the battery 32 provides power to the drawing board system 18. However, when the battery 32 is in a low battery state, hardware informs the system of the electronic device 10 to switch to the USB interface 121 for power supply, or reminds the user to plug in the power adapter 34 to connect to the mains for charging.

As shown in FIG. 1 and FIG. 5, in the electronic device 10, when the user selects the laptop mode through the switching switch 20, in the laptop mode, power is supplied by the internal battery 32 or the external power adapter 34. When the user selects the drawing board mode through the switching switch 20, in the drawing board mode, power is supplied by the internal battery 32, the external power adapter 34, or the USB interface 121. When the user selects the independent screen mode through the switching switch 20, in the independent screen mode, the power supply mode is determined according to whether an image input of the connection interface 12 has a power supply capability. If the image input of the connection interface 12 has the power supply capability, i.e., if the USB interface 121 is used, power required by an image and the touchscreen 24 is supplied by the USB interface 121, or power is supplied by the internal battery 32 or the external power adapter 34. In this case, the touchscreen 24 has the touch function. If the image input of the connection interface 12 does not have the power supply capability, i.e., if the DP interface 122 of FIG. 3A or the HDMI 123 of FIG. 4A is used, power is supplied by the internal battery 32 or the external power adapter 34. In this case, the touchscreen 24 does not have the touch function. If power is supplied by an external USB, it depends on whether the USB is connected by an external adapter or provided by an external device (a host computer). If the USB is connected by the external adapter, the touchscreen 24 does not have the touch function; and if the USB is provided by the external device, the touchscreen 24 has the touch function.

In an embodiment, as shown in FIG. 1, the switching switch 20 is, but not limited to, different physical switching switches such as a toggle switch, a key switch, or other similar components, so that the user physically switches different operating modes, to provide the switching signal through the switching switch 20.

In conclusion, the disclosure provides an electronic device with various operating modes, and the electronic device provides a laptop mode, a drawing board mode, and an independent screen mode, to meet the diversified requirement of the user. In addition, in the disclosure, when the operating mode of the drawing board mode or the independent screen mode is selected, an original internal main system (a laptop system) of the electronic device is maintained in a sleep mode or a power-off mode, to save unnecessary power consumption and meet the power-saving requirement.

The foregoing embodiments are merely for describing the technical ideas and the characteristics of the disclosure, and are intended to enable those skilled in the art to understand and hereby implement the content of the disclosure. However, the scope of claims of the disclosure is not limited thereto. In other words, equivalent changes or modifications made according to the spirit disclosed in the disclosure shall still fall into scope of the claims of the disclosure.

What is claimed is:
1. An electronic device, comprising:
at least one connection interface, to receive an external signal, wherein the connection interface is a universal serial bus (USB) interface, and the external signal is a USB signal;
a first signal switching multiplexer, electrically connected to the connection interface, to receive the external signal;
a laptop system, electrically connected to the first signal switching multiplexer, and configured to operate in a laptop mode;
a drawing board system, electrically connected to the first signal switching multiplexer, and configured to operate in a drawing board mode and an independent screen mode;
a switching switch, electrically connected to the first signal switching multiplexer, the laptop system, and the drawing board system, wherein the switching switch generates a switching signal and transmits the switching signal to the first signal switching multiplexer, the laptop system, and the drawing board system, to select the laptop mode in the laptop system, or the drawing board mode or the independent screen mode in the drawing board system according to the switching signal, so that the first signal switching multiplexer transmits the external signal to the laptop system or the drawing board system according to the switching signal, and the laptop system or the drawing board system performs corresponding processing according to a type of the external signal, to output an electronic signal; and a second signal switching multiplexer, electrically connected to the laptop system, the drawing board system, and the switching switch, to transmit the electronic signal to a corresponding touchscreen or touch controller according to the switching signal, wherein the touchscreen is electrically connected to the second signal switching multiplexer, to display the received electronic signal on the touchscreen; and the touch controller is electrically connected to the second signal switching multiplexer and the touchscreen, to control the touchscreen according to the received electronic signal;

wherein the drawing board system further comprises:

a USB hub, electrically connected to the first signal switching multiplexer and the second signal switching multiplexer, to receive the external signal, wherein the USB hub uses the external signal as the electronic signal, and transmits the electronic signal to the touch controller through the second signal switching multiplexer;

a first conversion unit, electrically connected to the USB hub, to receive the external signal and convert the external signal from the USB signal into a low-voltage differential signal (LVDS); and a second conversion unit, electrically connected to the first conversion unit and the second signal switching multiplexer, to convert the LVDS into a display port (DP) signal, wherein the second conversion unit uses the DP signal as the electronic signal, transmits the electronic signal to the touchscreen through the second signal switching multiplexer, and displays the electronic signal on the touchscreen.

2. The electronic device according to claim 1, wherein the laptop system further comprises a central processing unit (CPU), a memory unit, a storage unit, and a wireless unit, and the CPU is electrically connected to the first signal switching multiplexer, the second signal switching multiplexer, the memory unit, the storage unit, and the wireless unit.

3. The electronic device according to claim 1, wherein in the drawing board mode, the USB hub divides the external signal into two parts, one part is transmitted to the touch controller through the second signal switching multiplexer, to control the touchscreen, and the other part is converted into the DP signal through the first conversion unit and the second conversion unit, and then the DP signal is transmitted to the touchscreen through the second signal switching multiplexer and displayed on the touchscreen.

4. The electronic device according to claim 1, wherein in the independent screen mode, the USB hub transmits the external signal to the first conversion unit, converts the external signal into the DP signal through the first conversion unit and the second conversion unit, and then transmits the DP signal to the touchscreen through the second signal switching multiplexer and displays the DP signal on the touchscreen.

5. The electronic device according to claim 1, wherein the connection interface further comprises the USB interface and an image connection interface, and the external signal is the USB signal from the USB interface or an image signal from the image connection interface.

6. The electronic device according to claim 5, wherein the second conversion unit converts the LVDS into a first DP signal, uses the first DP signal as the electronic signal, and transmits the electronic signal to the touchscreen through the second signal switching multiplexer and displays the electronic signal on the touchscreen.

7. The electronic device according to claim 6, wherein in the drawing board mode, the USB hub divides the USB signal into two parts, one part is transmitted to the touch controller through the second signal switching multiplexer, to control the touchscreen, and the other part is converted into the first DP signal through the first conversion unit and the second conversion unit, and then the first DP signal is transmitted to the touchscreen through the second signal switching multiplexer and displayed on the touchscreen.

8. The electronic device according to claim 7, further comprising a transmission channel, electrically connected to the first signal switching multiplexer and the second signal switching multiplexer, wherein the transmission channel transmits the image signal from the first signal switching multiplexer to the touchscreen through the second signal switching multiplexer, and displays the image signal on the touchscreen.

9. The electronic device according to claim 8, wherein in the independent screen mode, the transmission channel transmits the image signal to the touchscreen through the second signal switching multiplexer, and displays the image signal on the touchscreen.

10. The electronic device according to claim 9, wherein the image connection interface is a DP interface, and the image signal is a second DP signal.

11. The electronic device according to claim 6, wherein the image connection interface is a high definition multimedia interface (HDMI), the image signal is an HDMI signal, and the drawing board system further comprises a third conversion unit, wherein the third conversion unit is electrically connected to the first signal switching multiplexer and the second signal switching multiplexer, and is configured to convert the HDMI signal from the first signal switching multiplexer into a second DP signal, and then transmit the second DP signal to the touchscreen through the second signal switching multiplexer and display the image signal on the touchscreen.

12. The electronic device according to claim 5, wherein the USB interface further provides power required by the laptop system and the drawing board system.

13. The electronic device according to claim 1, wherein the USB interface further provides power required by the laptop system and the drawing board system.

14. The electronic device according to claim 1, further comprising a battery electrically connected to the laptop system and the drawing board system, and further matching with a power adapter electrically connected to the laptop system and the drawing board system, wherein the electronic device selectively provides power to the laptop system and the drawing board system through the battery or the power adapter.

15. The electronic device according to claim 14, further comprising a power switching device, electrically connected to the laptop system, the drawing board system, the switching switch, the touchscreen, and the touch controller, wherein the power switching device provides power to the touchscreen or both the touchscreen and the touch controller according to the switching signal.

16. The electronic device according to claim 1, wherein when the drawing board system executes the drawing board mode or the independent screen mode, the laptop system is in a sleep state or a power-off state.

* * * * *